United States Patent [19]
Ochii

[11] Patent Number: 4,661,202
[45] Date of Patent: Apr. 28, 1987

[54] METHOD OF MANUFACTURING SEMICONDUCTOR DEVICE

[75] Inventor: Kiyofumi Ochii, Yokohama, Japan

[73] Assignee: Kabushiki Kaisha Toshiba, Kawasaki, Japan

[21] Appl. No.: 701,350

[22] Filed: Feb. 13, 1985

[30] Foreign Application Priority Data

Feb. 14, 1984 [JP] Japan .................................. 59-24459
Feb. 14, 1984 [JP] Japan .................................. 59-24460

[51] Int. Cl.⁴ ...................... H01L 21/306; B44C 1/22; C03C 15/00; C23F 1/02
[52] U.S. Cl. .................................. 156/643; 29/576 W; 29/580; 29/591; 156/648; 156/653; 156/657; 156/659.1; 156/662; 357/44; 357/55; 357/59
[58] Field of Search .................. 29/576 W, 580, 578, 29/591; 156/643, 646, 648, 653, 656, 657, 659.1, 661.1, 662; 427/85, 86, 88, 89, 90; 430/313, 317, 318; 357/44, 47, 48, 50, 55, 59, 71, 65; 204/192 E

[56] References Cited

U.S. PATENT DOCUMENTS

| | | | |
|---|---|---|---|
| 4,353,086 | 10/1982 | Jaccodine et al. | ............... 29/580 X |
| 4,454,646 | 6/1984 | Joy et al. | ............... 29/576 W |
| 4,477,310 | 10/1984 | Park et al. | ............... 29/580 X |
| 4,520,552 | 6/1985 | Arnould et al. | ............... 29/580 X |

*Primary Examiner*—William A. Powell
*Attorney, Agent, or Firm*—Finnegan, Henderson, Farabow, Garrett & Dunner

[57] ABSTRACT

A method of manufacturing a semiconductor device has the steps of forming at least one groove in a semiconductor substrate having at least one well in a surface region thereof, forming an insulating film on the overall surface of the semiconductor substrate including an inner surface of the groove, selectively etching the insulating film so as to leave the insulating film in the groove, and burying a conductive material in the groove whose inner surface is covered with the remaining insulating film so as to form a conductive layer which is connected to at least one member selected from the group consisting of the well and the semiconductor substrate, and to a power supply.

24 Claims, 25 Drawing Figures

F I G. 7
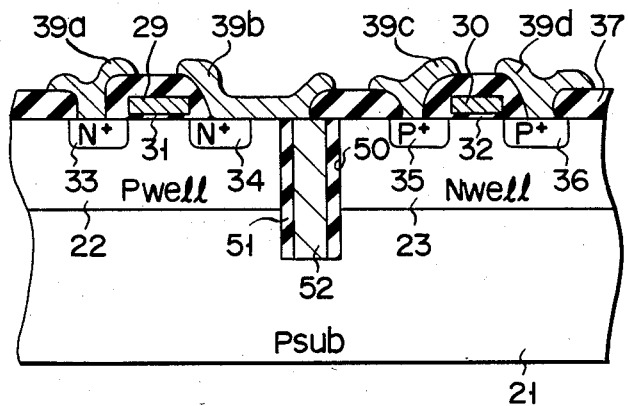
F I G. 8
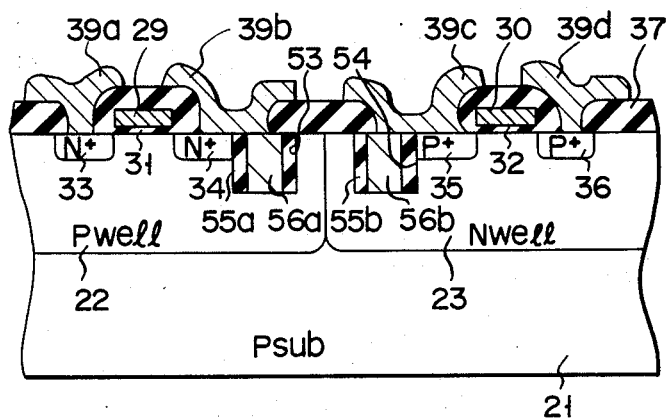
F I G. 9
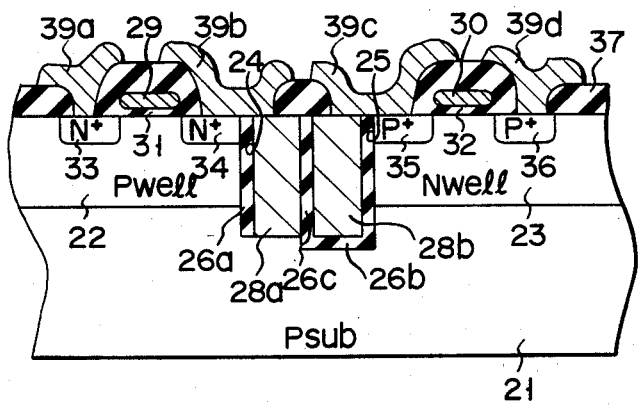

FIG. 10E
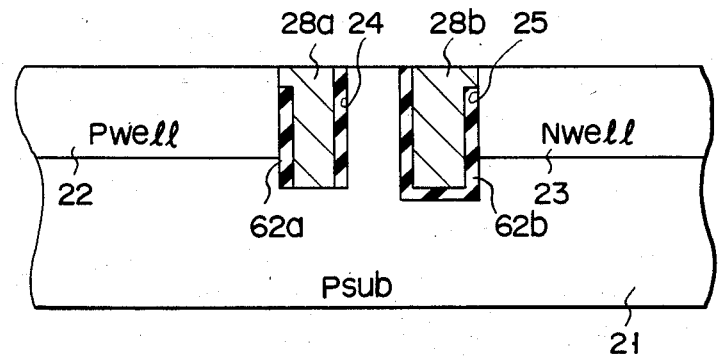
FIG. 10F
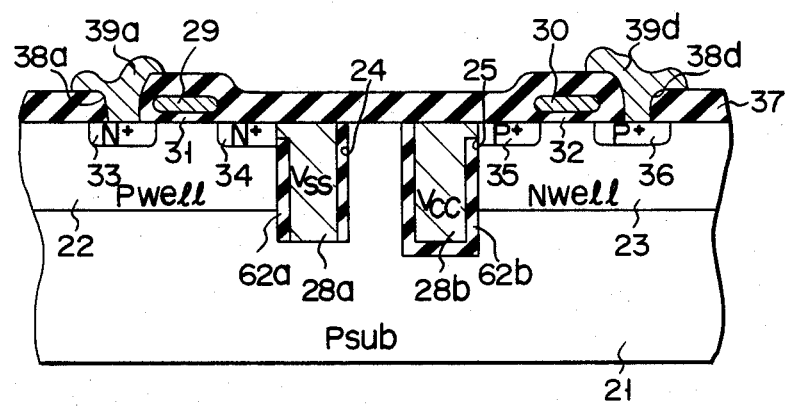
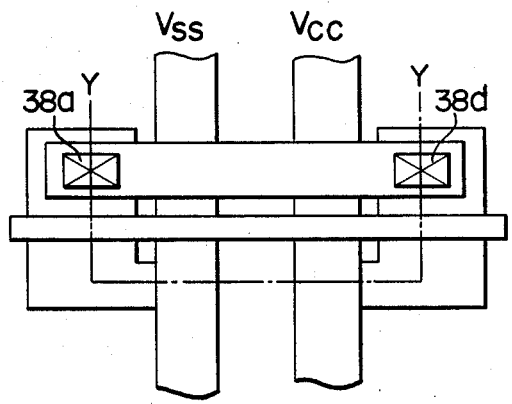
FIG. 11

METHOD OF MANUFACTURING SEMICONDUCTOR DEVICE

BACKGROUND OF THE INVENTION

The present invention relates to a method of manufacturing a semiconductor device and, more particularly, to a method of manufacturing a complementary type semiconductor device having a well in a surface region thereof.

In order to achieve micro-patterning of a complementary type semiconductor device such as a CMOS, a well isolation technique must be established. This is because most drawbacks of the CMOS transistor are associated with well isolation. For example, serious problems occur such as a decrease in a breakdown voltage between a P+-layer and a P-well (or an N+-layer and an N-well) upon scaling a device, a decrease in a latch-up breakdown voltage due to the thyristor effect, an increase in a chip area in accordance with well isolation, and the like.

A conventional CMOS transistor is manufactured in the following manner. Referring to FIG. 1, a P-well 2 and an N-well 3 are formed in a surface region of a P-type semiconductor substrate 1 by a known method, and thereafter, a groove 4 which reaches the substrate 1 is formed between the wells 2 and 3. The surface of the resultant structure is oxidized and a polycrystalline silicon layer is deposited on the overall surface thereof. The polycrystalline silicon layer is etched so as to leave it only in the groove 4. The polycrystalline silicon layer in the groove 4 is oxidized, thereby forming an insulating oxide film 5. Gate electrodes 6 and 7 are respectively formed on the P-well 2 and the N-well 3 through insulating films 8 and 9 by a known method. An N-type impurity is doped in the P-well 2 using the gate electrode 6 as a mask so as to form source and drain regions 10 and 11. In the same manner, a P-type impurity is doped in the N-well 3 using the gate electrode 7 as a mask so as to form source and drain regions 12 and 13. Thereafter, an intervening insulating film 14 is formed on the overall surface of the resultant structure, and contact holes 15 corresponding to the respective source and drain regions are then formed. Interconnection wiring 16 is formed to be connected to a Vss terminal (power line) through the contact hole 15 corresponding to the source region 10 of the P-well 2. Interconnection wiring 17 is formed to be connected to a Vcc terminal (power line) through the contact hole 15 corresponding to the source region 12 of the N-well 3. Furthermore, interconnection wiring 18 is formed to connect the drain regions 11 and 13 of the P-and N-wells 2 and 3 through the corresponding contact holes 15, thus obtaining a CMOS transistor.

In the CMOS transistor manufactured in this manner, isolation between the P- and N-wells 2 and 3 is performed by the insulating oxide film 5 buried in the groove 4. For this reason, a breakdown voltage between the P+-type drain region 13 and the P-well 2 (or between the N+-type drain region 11 and the N-well 3) is determined by a distance between the drain region 13 (or drain region 11) and the P-type substrate 1 and is considerably improved. Since a lateral PNPN structure is divided by the oxide film 5, the thyristor effect can be prevented, thus improving a latch-up breakdown voltage. In this case, it should be noted that in order to prevent the latch-up phenomenon, the substrate 1 or the P-well 2, and the N-well 3 must be sufficiently biased by Vss and Vcc voltages. For this reason, in the transistor shown in FIG. 1, the Vss and Vcc terminals are formed on the insulating film 14, and Vss and Vcc voltages bias the P- and N-wells through the contact holes formed in the insulating film 14. However, in an arrangement of, e.g., a memory cell, if the Vss and Vcc terminals are provided in a portion of high density layout, the contact holes are formed therein, and Vss and Vcc voltages bias the P- and N-wells 2 and 3 through these terminals and contact holes, micro-patterning of the device is prevented.

In another prior art example, as shown in FIG. 2, a CMOS transistor has a structure in which the N+-type drain region 11 of the P-well 2 and the P+-type drain region 13 of the N-well 3 are formed to be in contact with the insulating oxide film 5. In the transistor with such a structure, since the drain regions 11 and 13 are formed to be in contact with the insulating oxide film 5, the area of a boundary portion between the P- and N-wells 2 and 3 can be decreased and a capacitance at side surfaces of the drain regions 11 and 13 can be reduced. However, in the CMOS transistor shown in FIG. 2, a leakage current undesirably flows through the contact surfaces between the insulating oxide film 5 and the drain regions 11 and 13. This is a serious drawback in the CMOS transistor which has a feature of low power consumption.

SUMMARY OF THE INVENTION

It is an object of the present invention to provide a method of manufacturing a semiconductor device in which a chip area is reduced and micro-patterning of an element can be achieved.

According to the present invention, there is provided a method of manufacturing a semiconductor device, comprising the steps of:

forming at least one groove in a semiconductor substrate having at least one well in a surface region thereof;

forming an insulating film on the overall surface of the semiconductor substrate including an inner surface of the groove;

selectively etching the insulating film so as to leave the insulating film in the groove; and burying a conductive material in the groove whose inner surface is covered with the remaining insulating film so as to form a conductive layer which is connected to the well and/or the semiconductor substrate, and to a power supply.

The semiconductor substrate having at least one well in the surface region thereof can be a semiconductor substrate of a first conductivity type, in a surface region of which a well of a second conductivity type is formed, or a semiconductor substrate of the first conductivity type, in a surface region of which a first well of the first conductivity type and a second well of the second conductivity type are formed.

The groove can be formed in or adjacent to the well. The bottom of the groove can be in the well or can reach the substrate.

An oxide film can be used as the insulating film.

The insulating film can be etched by reactive ion etching. Reactive ion etching of the insulating film is performed using a resist film formed in the groove as a mask, thereby leaving the insulating film on the overall inner surface of the groove. Alternatively, the overall structure is subjected to reactive ion etching without using the resist film as an etching mask, thereby removing the insulating film on the bottom surface of the groove and leaving it only on side walls of the groove. In addition, etching can be performed using the resist film as a mask so as to leave the insulating film on the inner surface of the groove except for at least a portion of the insulating film on the upper side walls of the groove. Furthermore, etching can be performed so as to remove a portion of the insulating film on the bottom surface of the groove and at least a portion of the insulating film on the upper side walls thereof.

Molybdenum, tungsten, a silicide thereof, and a polycrystalline silicon film containing an impurity can be used as the conductive material. When the conductive layer is formed in the groove by burying the conductive material therein, the conductive material is deposited on the overall surface of the resultant structure including the inner surface of the groove so as to completely fill the groove with the conductive material, and the surface of the deposited conductive layer is substantially flattened. Thereafter, the deposited conductive layer is subjected to reactive ion etching.

The conductive layer in the groove can be used as a Vss or Vcc terminal. Generally, Vss is set at ground potential, and Vcc is set at 5 V. When the insulating film on the bottom surface of the groove and/or on the upper side walls is removed, the conductive layer directly forms an ohmic contact with the well and/or the substrate. When the overall inner surface of the groove is covered with the insulating film, the conductive layer is connected to the well through an electrode which is separately formed.

Two grooves can be formed. In this case, the conductive layer formed in one groove serves as the Vss terminal, and the conductive layer formed in the other groove serves as the Vcc terminal. Portions of inner surfaces of the two grooves from which the insulating film is to be removed can be combined as needed. In this case, a conductive type of the substrate or well connected to the conductive layer formed in one groove must be opposite to that of the substrate or well connected to the conductive layer formed in the other groove. For example, when P- and N-wells are formed in a surface region of a P-type substrate, the removing portions of the insulating film on the inner surfaces of the two grooves must be selected so as to connect one conductive layer to the P-well or the substrate and connect the other conductive layer to the N-well.

Note that an impurity having the same conductivity type as that of the conductive layer is doped in a portion of the well or the substrate to be connected thereto, thereby obtaining a good ohmic contact.

As described above, according to the present invention, a terminal connected to a power supply is buried in a portion which is conventionally used for isolation, thereby reducing a chip area and achieving micro-patterning of the element.

BRIEF DESCRIPTION OF THE DRAWINGS

FIGS. 6 to 9 are sectional views showing various modifications of the embodiment shown in FIGS. 3A to 3E;

FIGS. 10A to 10F are sectional views showing manufacturing steps of a CMOS transistor according to another embodiment of the present invention;

FIG. 11 is a plan view of FIG. 10F;

DETAILED DESCRIPTION OF THE PREFERRED EMBODIMENT

Examples in which the present invention is applied in a method of manufacturing a CMOS transistor will be described with reference to the accompanying drawings.

EXAMPLE 1

In Example 1, an insulating film on a bottom surface of one of two grooves is removed so as to directly form an ohmic contact between a conductive layer buried therein and a P-substrate, and a conductive layer buried in the other groove is connected to an N-well through an electrode.

Figure 1:
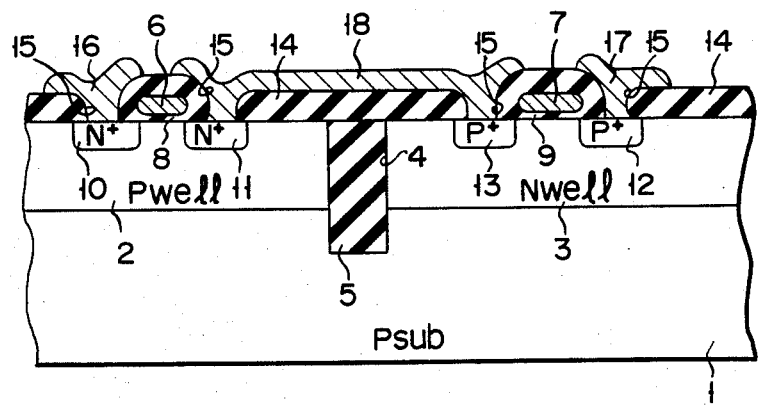
FIG. 1 is a sectional view of a prior art CMOS transistor.
Figure 2:
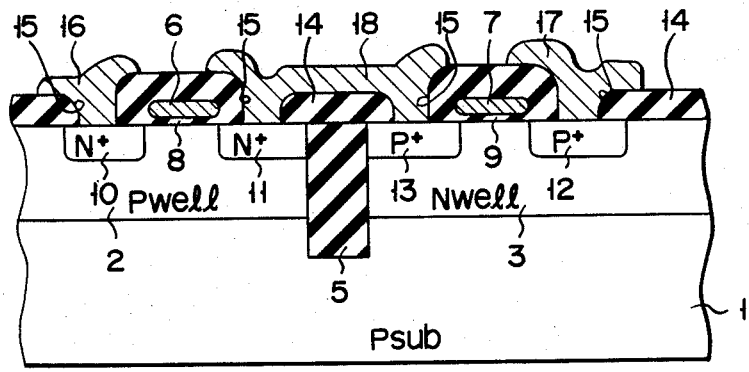
FIG. 2 is a sectional view of another prior art CMOS transistor.
Figure 3A:
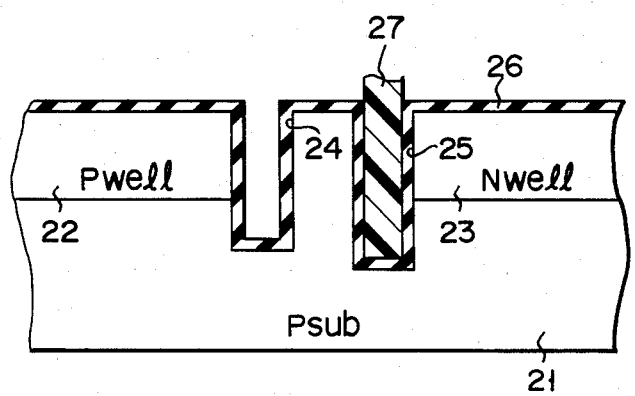
FIGS. 3A to 3E are sectional views showing manufacturing steps of a CMOS transistor according to an embodiment of the present invention.

(i) A P-well 22 and an N-well 23 were locally formed in a surface of, e.g., a P-type silicon substrate 21. Two grooves which reached the substrate 21 were formed in a portion between the wells 22 and 23. The resultant structure was subjected to oxidation so as to form an oxide film 26 on the overall surface thereof including inner surfaces of the grooves 24 and 25. A photoresist film 27 was formed on a portion of the oxide film to remain in a later step, i.e., in the groove 25 whose inner surface was covered with the oxide film 26 (FIG. 3A). Thereafter, the oxide film 26 was selectively etched by reactive ion etching (RIE) using the photoresist film 27 as a mask, thereby leaving an oxide film 26a on side walls of the groove 24 and an oxide film 26b on side walls and bottom surface of the groove 25.

Figure 3B:
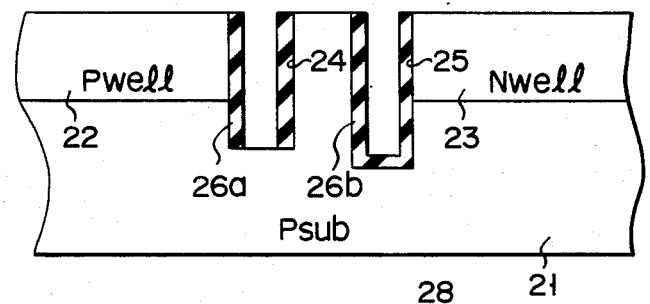
Figure 3C:
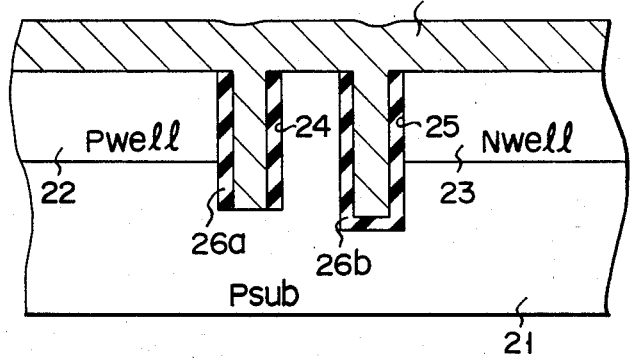

The photoresist film 27 was removed (FIG. 3B). Furthermore, a high-melting point metal film such as a molybdenum (Mo) film was deposited on the overall surface of the resultant structure so that an Mo layer 28 was formed to fill the grooves 24 and 25 through the remaining oxide films 26a and 26b (FIG. 3C). Note that the Mo layer 28 forms an ohmic contact with the substrate 21 at the bottom surface of the groove 24.

Figure 3D:
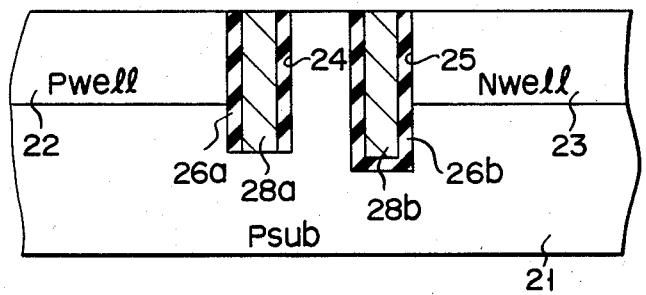
Figure 3E:
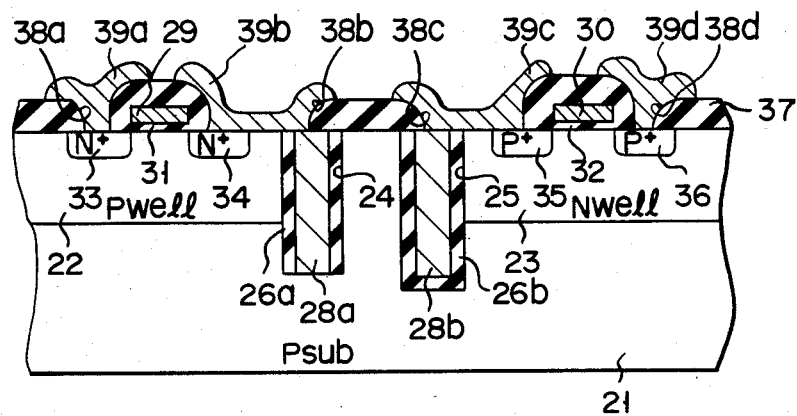
Figure 4:
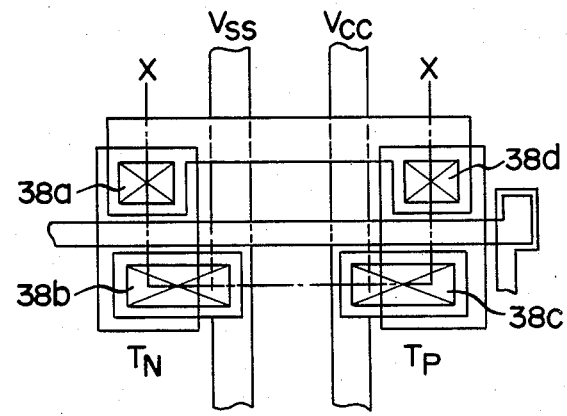
FIG. 4 is a plan view of FIG. 3E.

(ii) The Mo layer 28 was removed by RIE so as to bury Mo layers 28a and 28b serving as Vss and Vcc terminals (power supply) in the grooves 24 and 25 through the remaining oxide films 26a and 26b, respectively (FIG. 3D). Gate electrodes 29 and 30 were formed on the P- and N-wells 22 and 23 through gate insulating films 31 and 32. An N-type impurity was doped in the P-well 22 using the gate electrode 29 as a mask so as to form N$^+$-type source and drain regions 33 and 34 in the surface of the P-well 22. Thereafter, a P-type impurity was doped in the N-well 23 using the gate electrode 30 as a mask so as to form P$^+$-type source and drain regions 35 and 36. Subsequently, an interlayer insulating film 37 was formed on the overall surface of the resultant structure. Portions of the insulating film 37 corresponding to the source and drain regions 33 and 34 in the P-well 22, the Mo layers (Vss and Vcc terminals) 28a and 28b in the grooves 24 and 25, and the source and drain regions 35 and 36 in the N-well 23 were removed so as to form contact holes 38a to 38d. Furthermore, interconnection wiring layers 39a to 39d were formed in the contact holes 38a to 38d, thus manufacturing a CMOS transistor comprising an NMOS transistor (Tn) and a PMOS transistor (Tp) (FIGS. 3E and 4). Note that the interconnection wiring 39b is connected to the N+-type drain region 34 in the P-well 22, the P-well, and the Mo layer 28a in the groove 24. A bias potential is applied to the substrate 21 through the Mo layer 28a connected to the Vss terminal. On the other hand, the interconnection wiring layer 39c is connected to the Mo layer 28b in the groove 25, the N-well 23, and the P+-type source region 35 in the N-well 23. A bias potential is applied to the N-well 23 through the Mo layer 28b connected to the Vcc terminal and the interconnection wiring layer 39c. Note that FIG. 3E is a sectional view taken along a line X—X of FIG. 4.

In this manner, according to the present invention, the grooves 24 and 25 which reach the silicon substrate 21 are formed in a portion between the P- and N-wells 22 and 23 which is a dead area in a conventional device, and the Mo layers 28a and 28b connected to the Vss and Vcc terminals (power supply lines) are buried in the grooves 24 and 25 so as to bias the substrate 21 and the N-well 23. For this reason, a portion conventionally occupied as a power supply line area is not needed, thereby reducing a chip area and achieving micropatterning of the element. This is effective in a highly integrated device such as a memory.

Figure 5:
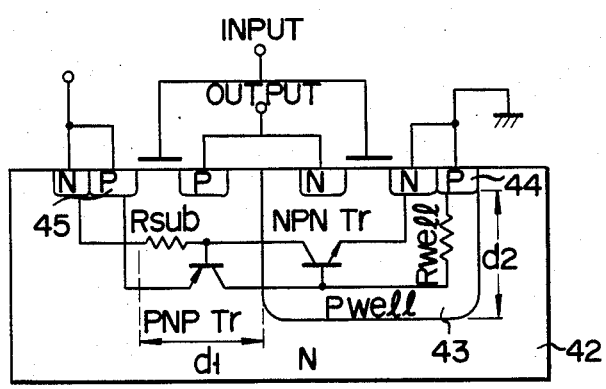
FIG. 5 is a view showing an equivalent circuit of the CMOS transistor shown in FIG. 3E.

For the same reason, electrons or holes generated can be quickly bypassed to the power supply line from the substrate 21 and the N-well 23, thereby improving latch-up resistance. FIG. 5 shows an equivalent circuit of the CMOS transistor. Referring to FIG. 5, assume that a distance between a bottom surface of a P-well 43 in a surface of an N-type silicon substrate 42 and a P-type diffusion layer 44 in a surface of the P-well 43 is represented by $d_2$, a distance between an edge of the P-well 43 and a P-type diffusion layer 45 is represented by $d_1$, a resistance of the N-type silicon substrate 42 is represented by Rsub, and a resistance of the P-well 43 is represented by Rwell. In this case, it is difficult for the latch-up phenomenon to occur when the distances $d_1$ and $d_2$ are larger and the resistances Rsub and Rwell are lower. According to the present invention, Rsub = Rwell $\approx$ 0 can be always realized.

Figure 6:
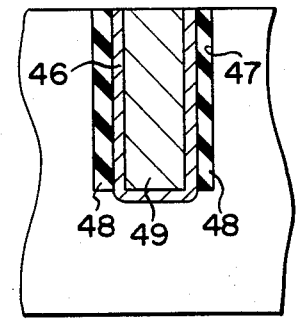

In the above Example, the case where the Mo layers as conductive layers of low resistance are buried in the two grooves through the remaining oxide films has been described. However, the present invention is not limited to this. For example, a polycrystalline silicon layer in which an impurity of the same conductivity type as that of the substrate is sufficiently doped can be used as the conductive layer in place of the Mo layer. Alternatively, as shown in FIG. 6, after forming a high-melting point metal layer 46 on an inner surface of a groove 47 through an oxide film 48, an impurity-doped polycrystalline silicon layer 49 (or an oxide film such as $SiO_2$) can be buried in the groove 47.

In the above Example, the case where the two grooves for the Vcc and Vss terminals are formed in the boundary portion of the wells has been described. However, the present invention is not limited to this. For example, as shown in FIG. 7, only a groove 50 for biasing the substrate 21 is provided and an oxide film 51 is formed on side surfaces of the groove 50. Thereafter, a refractory metal layer 52 connected to the Vss terminal can be buried. In this case, Vcc biases the N-well 23 through the interconnection wiring 39c.

As shown in FIG. 8, shallow grooves 53 and 54 which do not reach the substrate 21 are respectively formed in the P- and N-wells 22 and 23, and oxide films 55a and 55b are formed only on side walls of the grooves 53 and 54. Thereafter, conductive layers 56a and 56b are buried in the grooves 53 and 54. With this structure, the P- and N-wells 22 and 23 can be biased through these conductive layers 56a and 56b.

Furthermore, as shown in FIG. 9, the conductive layers 28a and 28b can be formed in the grooves 24 and 25 shown in FIG. 3E through the oxide films 26a and 26b so as to be adjacent to each other, and an oxide film 26c can be provided between the layers 28a and 28b. Note that in FIG. 9, the conductive layer 28b is illustrated as if not connected to the N-well 23. However, the conductive layer 28b is connected to the N-well 23 through the interconnection wiring layer 39c at a portion in which no P+-region 35 is formed.

EXAMPLE 2

In Example 2, an upper portion of an insulating film formed on one side wall of each of two grooves is removed, and conductive layers buried in the grooves are in direct ohmic-contact with P- and N-wells, respectively.

Figure 10A:
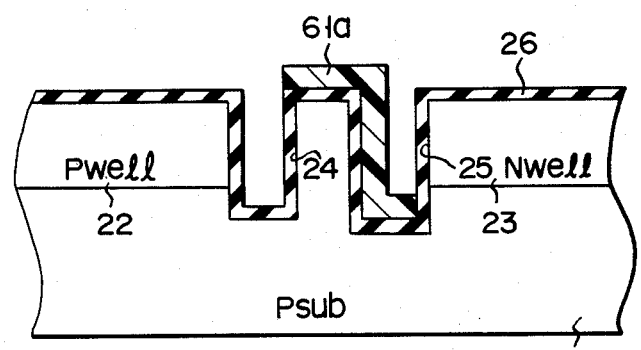
Figure 10B:
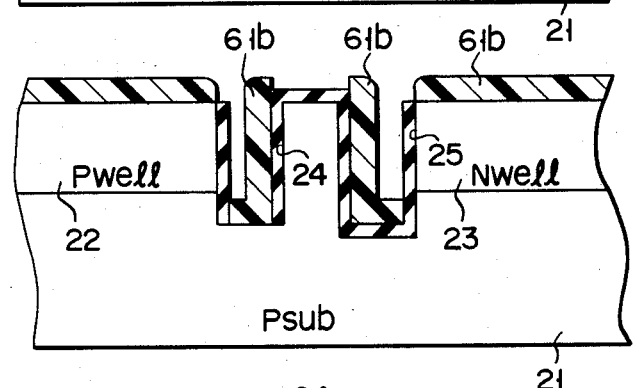
Figure 10C:
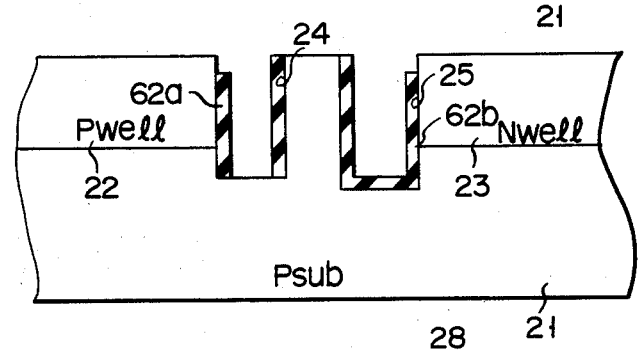

(i) P- and N-wells 22 and 23 were respectively formed in a surface region of, e.g., a P-type silicon substrate 21. Grooves 24 and 25 were formed in a portion between the wells 22 and 23 so as to reach the surface of the substrate 21. The resultant structure was oxidized so as to form an oxide film 26, and thereafter, a photoresist film 61a was formed at a predetermined position, i.e., on a region extending from a bottom portion of the groove 25 to a side wall of the groove 24 via a side wall of the groove 25 (FIG. 10A). Thereafter, the oxide film 26 was selectively removed by RIE except for portions thereof on the side walls of the groove 24, the inner surface of the groove 25 and a surface of the substrate 21 between the grooves 24 and 25. Furthermore, after removing the photoresist film 61a, photoresist films 61b were formed on bottom surfaces of the grooves 24 and 25 and on the oxide films on the side walls of the grooves not adjacent to the wells 22 and 23 (FIG. 10B). Subsequently, the remaining oxide films were selectively removed using the photoresist film 61b as a mask. As a result, an oxide film 62a was retained on the side walls of the groove 24 except for an upper side wall portion at the P-well 22 side. Similarly, an oxide film 62b was retained on the side walls and the bottom surface of the groove 25 except for an upper side wall portion at the N-well 23 side. Thereafter, the photoresist film 61b was removed (FIG. 10C).

Figure 10D:
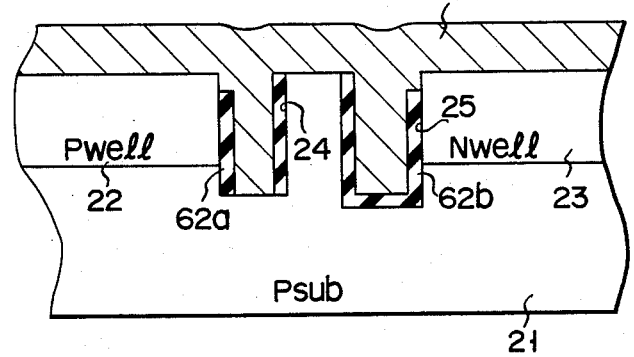

(ii) A high-melting point metal film such as a molybdenum (Mo) film was formed on the resultant structure so as to form an Mo layer 28 (FIG. 10D). Note that the Mo layer 28 forms an ohmic contact with the substrate 21. The Mo layer 28 was removed by RIE so as to bury Mo layers 28a and 28b which respectively served as Vss and Vcc terminals (power supply lines) in the grooves 24 and 25 through the oxide films 62a and 62b, respectively (FIG. 10E). Note that the Vss and Vcc terminals are used for biasing the substrate 21 and the N-well 23.

Gate electrodes 29 and 30 were respectively formed on the P- and N-wells 22 and 23 through gate insulating films 31 and 32. Thereafter, an N+-type source region 33 and an N+-type drain region 34 which was connected to the Mo layer 28a in the groove 24 were formed in the surface of the P-well 22 using the gate electrode 29 as a mask. A P+-type source region 35 connected to the Mo layer 28b in the groove 25 and a P+-type drain region 36 were formed in the surface of the N-well 23 using the other gate electrode 30 as a mask. Subsequently, an interlayer insulating film 37 was formed on the overall surface of the resultant structure. Thereafter, portions of the interlayer insulating film 37 corresponding to the drain regions 34 and 36 of the P- and N-wells 22 and 23 were removed, thereby forming contact holes 38a and 38d. Interconnection wiring layers 39a and 39d were formed in the contact holes 38a and 38d, respectively, thus obtaining a CMOS transistor consisting of an NMOS transistor (Tn) and a PMOS transistor (Tp) (FIGS. 10F and 11). Note that FIG. 10F is a sectional view taken along a line Y—Y of FIG. 11. Furthermore, it should be noted that the Mo layer 28b forms an ohmic contact with the N-well 23 at a position at which no source region 35 is formed and from which the insulating film 62b is removed.

In this Example, the grooves 24 and 25 which reach the substrate 21 are formed in a portion between the P- and N-wells 22 and 23, and the Mo layers 28a and 28b are buried in the grooves 24 and 25 through the oxide films 62a and 62b so as to be connected to the Vss and Vcc terminals as power supply lines, thereby biasing the substrate 21 and the N-well 23. For this reason, no contact hole is required only for biasing a well, unlike a conventional device, thus considerably reducing a chip area and achieving micro-patterning of the element. This can be effective for a highly integrated device such as a memory.

Figure 12:
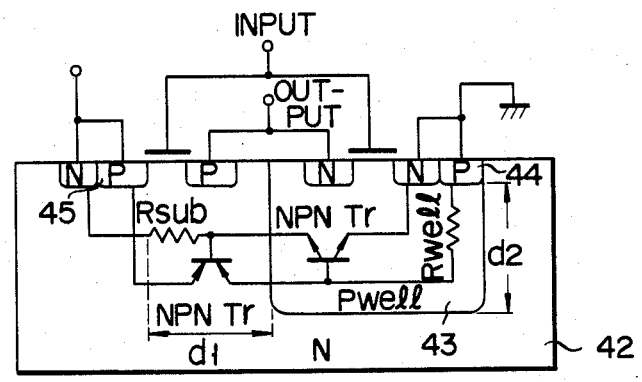
FIG. 12 is a view showing an equivalent circuit of the CMOS transistor shown in FIG. 10F.

For the same reason, electrons and holes generated can be bypassed through the substrate 21 and the N-well 23 to the power supply lines, thus improving latch-up resistance. FIG. 12 shows an equivalent circuit of the CMOS transistor. Referring to FIG. 12, assume that a distance between a bottom surface of a P-well 43 in a surface of an N-type silicon substrate 42 and a P-type diffusion layer 44 in a surface of the P-well 43 is represented by $d_2$, a distance between an edge of the P-well 43 and a P-type diffusion layer 45 is represented by $d_1$, a resistance of the N-type silicon substrate 42 is represented by Rsub, and a resistance of the P-well 43 is represented by Rwell. In this case, it is difficult for the latch-up phenomenon to occur when the distances $d_1$ and $d_2$ are larger and the resistances Rsub and Rwell are lower. According to the present invention, Rsub=-Rwell $\approx$ 0 can be always realized.

In the above Example, the case where the Mo layers as conductive layers of low resistance are buried in the two grooves through the remaining oxide films has been described. However, the present invention is not limited to this. For example, a polycrystalline silicon layer, in which an impurity of the same conductivity type as that of the substrate is sufficiently doped, can be used as the conductive layer in place of the Mo layer.

Figure 13:
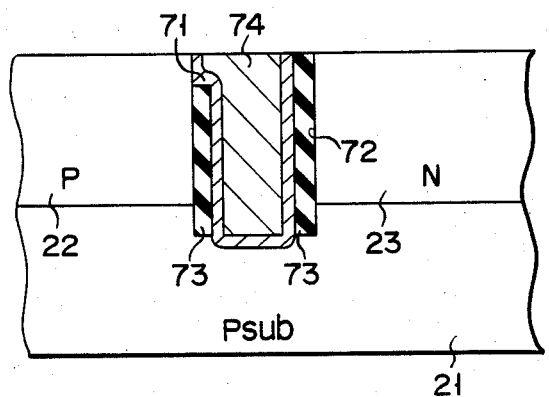
FIGS. 13 to 16 are sectional views showing various modifications of the embodiment shown in FIGS. 10A to 10F.

Alternatively, as shown in FIG. 13, after forming a high-melting point metal layer 71 on an inner surface of a groove 72 through an oxide film 73, an impurity-doped polycrystalline silicon layer 74 (or an oxide film such as $SiO_2$) can be buried in the groove 72.

Figure 14:
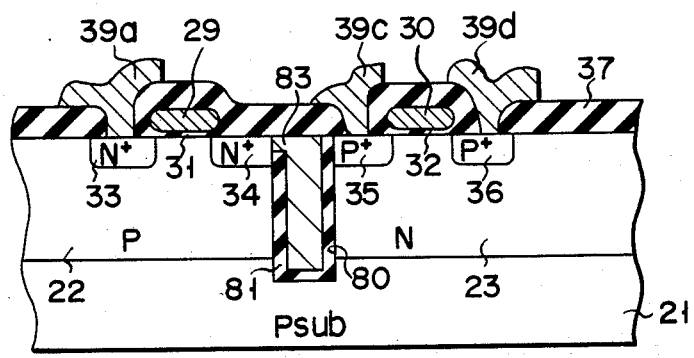

In the above Example, the case where the two grooves for the Vcc and Vss terminals are provided in a boundary portion of the wells has been described. However, the present invention is not limited to this. For example, as shown in FIG. 14, only a groove 80 for biasing the P-well 22 is provided, and an oxide film 81 whose upper portion on one side wall of the groove 80 is removed is formed on an inner surface of the groove 80. Then, a refractory metal layer 83 connected to the Vss terminal can be buried in the groove 80. In this case, Vcc biases the N-well 23 through the interconnection electrode layer 39c.

Figure 15:
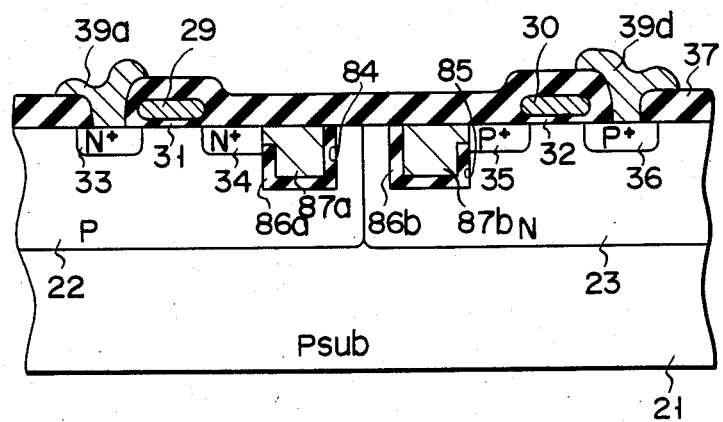

As shown in FIG. 15, the transistor of this Example can have the following structure in which shallow grooves 84 and 85 which do not reach the substrate 21 are formed in the P- and N-wells 22 and 23, oxide films 86a and 86b in which an upper side portion of each is removed therefrom are formed on inner surfaces of the grooves 84 and 85, and conductive layers 87a and 87b are thereafter buried in the grooves 84 and 85, thus biasing Vss and Vcc to the P- and N-wells 22 and 23 through the conductive layers 87a and 87b.

Figure 16:
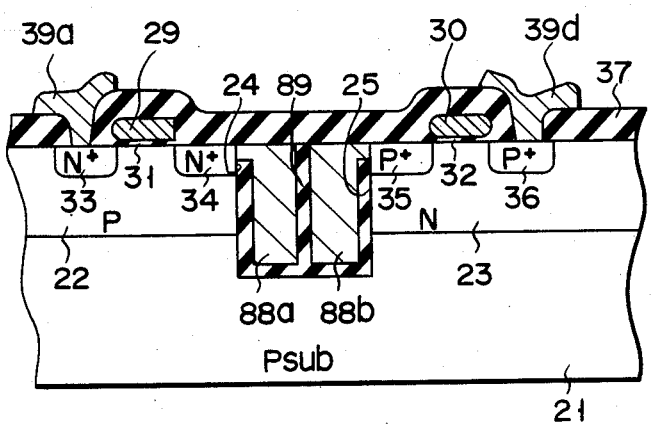

Furthermore, as shown in FIG. 16, the two grooves can be formed adjacent to each other and an oxide film 89 can be provided between conductive layers 88a and 88b.

What is claimed is:

1. A method of manufacturing a semiconductor device comprising the steps of:
   forming first and second grooves in a semiconductor substrate having at least one well in a surface region thereof;
   forming an insulating film on an overall surface of said semiconductor substrate including inner surfaces of the grooves;
   selectively etching said insulating film and leaving said insualting film in the first and second grooves; and
   burying a conductive material in the first and second grooves having inner surfaces covered with the insulating film to form a first conductive layer in the first groove and a second conductive layer in the second groove, said second conductive layer being set at a substrate potential and said first conductive layer being set at a potential different from said substrate potential.

2. A method according to claim 1, wherein said first conductive layer buried in the first groove is electrically connected to a first well, and said second conductive layer buried in the second groove is electrically connected to a second well or said semiconductor substrate.

3. A method according to claim 2, wherein said first and second conductive layers are electrically connected to said first and second wells through interconnection electrodes.

4. A method according to claim 2, wherein said first conductive layer is electrically connected to said first well through an interconnection electrode, and said second conductive layer forms an ohmic contact with said semiconductor substrate or said second well at a bottom portion of the second groove from which the insulating film formed thereon has been removed.

5. A method according to claim 2, wherein said first and second conductive layers respectively form ohmic contacts with said first and second wells at respective upper side wall portions of the first and second grooves from which the insulating film formed thereon has been removed.

6. A method according to claim 2, wherein said first conductive layer forms an ohmic contact with said first well at an upper side wall portion of the first groove from which the insulating film formed thereon is removed, and said second conductive layer forms an ohmic contact with said semiconductor substrate or said well at a bottom portion of the second groove from which the insulating film formed thereon has been removed.

7. A method according to claim 2, wherein said first and second conductive layers respectively form ohmic contacts with said first and second wells through respective bottom portions of the first and second grooves from which the insulating film formed thereon has been removed.

8. A method according to claim 2, wherein said semiconductor device is a complementary type MOS transistor comprising a first MOS transistor formed in said first well and a second MOS transistor formed in said second well.

9. A method according to claim 8, wherein said first conductive layer serves as a Vcc terminal, and said second conductive layer serves as a Vss terminal.

10. A method according to claim 1, wherein said first and second conductive layers are formed of conductive material selected from the group consisting of refractory metal and polycrystalline silicon containing an impurity.

11. A method according to claim 10, wherein the refractory metal is molybdenum.

12. A method of manufacturing a semiconductor device comprising the steps of:
forming first and second grooves in a semiconductor substrate having at least one well in a surface region thereof, said first and second grooves being deeper than said well;
forming an insulating film on an overall surface of said semiconductor substrate including inner surfaces of the grooves;
selectively etching said insulating film and leaving that portion of said insulating film which covers the inner surfaces of said first groove and only an inner side surface of said second groove; and
burying a conductive material in the first and second grooves having inner surfaces covered with the remaining insulating film to form a first conductive layer in the first groove and a second conductive layer in the second groove, said second conductive layer being set at a substrate potential and forming an ohmic contact with said substrate at a bottom portion of the second groove from which the insulating film formed thereon has been removed.

13. A method according to claim 12, wherein said semiconductor substrate is of a first conductivity type and includes a first well of a second conductivity type and a second well of the first conductivity type in a surface region thereof, said first and second grooves being formed between said first and second wells, and said first and second conductive layes form ohmic contacts with said first and second wells respectively at respective upper side wall portions of the first and second grooves from which the insulating film formed thereon has been removed by said etching.

14. A method of manufacturing a semiconductor device comprising the steps of:
forming a groove in a semiconductor substrate having at least one well in a surface region thereof;
forming an insulating film on the overall surface of said semiconductor substrate including an inner surface of the groove;
selectively etching said insulating film to leave said insulating film in the groove;
forming a refractory metal layer on the insulating film on an inner surface of the groove; and
burying polycrystalline silicon containing an impurity in the groove having said inner surface covered with the insulating film and refractory metal to form a conductive layer which comprises the refractory metal layer and polycrystalline silicon layer and is connected to at least one member selected from the group consisting of said well and said semiconductor substrate, and to a power supply.

15. A method according to claim 14, wherein said refractory metal is molybdenum.

16. A method according to claim 14, wherein said conductive layer is electrically connected to said well through an interconnection electrode.

17. A method according to claim 14, wherein said insulation film is removed from a bottom portion of one groove and said conductive layer forms an ohmic contact with said well or said substrate at said bottom portion of the groove from which the insulating film has been removed.

18. A method according to claim 14, wherein said conductive layer forms an ohmic contact with said well at one upper side wall portion from which the insulating film has been removed.

19. A method according to claim 14, wherein a groove is formed to extend deeper than a lower surface of said well.

20. A method according to claim 14, wherein a groove is formed in said well.

21. A method according to claim 14, wherein said semiconductor substrate is of a first conductivity type, and comprises a first well of a second conductivity type in a surface region thereof.

22. A method according to claim 21, wherein said semiconductor substrate further comprises a second well of the first conductivity type in the surface region thereof.

23. A method according to claim 22, wherein a first groove is formed between said first and second wells.

24. A method according to claim 23, wherein a second groove is also formed between said first and second wells.

* * * * *